United States Patent [19]

Ozawa et al.

[11] 4,356,455

[45] Oct. 26, 1982

[54] AMPLIFIER

[75] Inventors: Akio Ozawa; Susumu Sueyoshi; Keishi Saito; Kikuo Ishikawa; Kiyomi Yatsuhashi; Satoshi Ishii; Masamichi Yumino, all of Tokyo, Japan

[73] Assignee: Pioneer Electronic Corporation, Tokyo, Japan

[21] Appl. No.: 187,891

[22] Filed: Sep. 17, 1980

[30] Foreign Application Priority Data

Sep. 21, 1979 [JP] Japan ................................ 54-121647

[51] Int. Cl.$^3$ ................................................ H03F 3/04

[52] U.S. Cl. .................................... 330/296; 330/288

[58] Field of Search ........................ 330/288, 296, 311

[56] References Cited

U.S. PATENT DOCUMENTS 3,450,998 6/1969 Greefkes et al. .................... 330/296

*Primary Examiner*—James B. Mullins

*Assistant Examiner*—Gene Wan

*Attorney, Agent, or Firm*—Sughrue, Mion, Zinn, Macpeak & Seas

[57] ABSTRACT

An amplifier circuit in which the non-linear distortion of the amplifier transistors caused by non-linear base-emitter input and output characteristics is eliminated without the use of negative feedback. A first transistor and a second transistor of opposite conductivity type are coupled with the output of the first transistor connected to the base of the second transistor and with an input signal applied to the base of the first transistor. Currents are applied to the first and second transistors, such as with the current mirror circuit, in such a manner that the ratio of the currents is a predetermined constant value. Bias voltages are applied to the circuit such that the ratio of the collector-emitter voltage of the first transistor to the collector-emitter voltage of the second transistor is the reciprocal of the predetermined constant value.

6 Claims, 2 Drawing Figures

AMPLIFIER

BACKGROUND OF THE INVENTION

The present invention relates to amplifiers and more particularly to a wide-band amplifier using bipolar transistors.

In an amplifier used for amplifying wide-band signals such as video signals, it is essential that distortion of the amplifier be minimized. For this purpose, a method of suppressing distortion through negative feedback has been extensively employed. However, the employment of negative feedback unavoidably reduces the amplification factor. Accordingly, a high number of amplifying elements or stages are necessary to obtain a desired amplification factor. This leads to problems regarding the stability of the amplifier circuit.

In the usual case where the amplifying elements used are transistors, the base-emitter input and output characteristics of the transistors are non-linear for particular operating regions. In order to overcome problems caused by the non-linear characteristics, large currents must be applied to the transistors or negative feedback employed. However, none of these techniques are fully acceptable, and especially the technique of utilizing negative feedback involves difficulties.

SUMMARY OF THE INVENTION

Accordingly, an object of the invention is to provide a transistor amplifier in which the aforementioned non-linear distortion of the amplifying transistors is improved without using negative feedback.

A specific feature of an amplifier constructed according to the invention resides in that a first transistor and a second transistor opposite in conductivity to the first transistor are provided, the output of the first transistor, to the base of which an input signal is applied, is applied to the base of the second transistor, currents $I_1$ and $I_2$ are applied to the first and second transistors, respectively, in such a manner that the ratio of the current $I_1$ to the current $I_2$ is $1/\alpha$ where $\alpha$ is constant, and bias is applied in such a manner that the ratio of the collector-emitter voltage $V_{CE1}$ of the first transistor to the collector-emitter voltage $V_{CE2}$ of the second transistor is $\alpha$, wherein an output is provided without distortion in response to variations of current in the first or second transistor.

DESCRIPTION OF THE PREFERRED EMBODIMENTS

The invention will be described with reference to the accompanying drawings.

Figure 1:
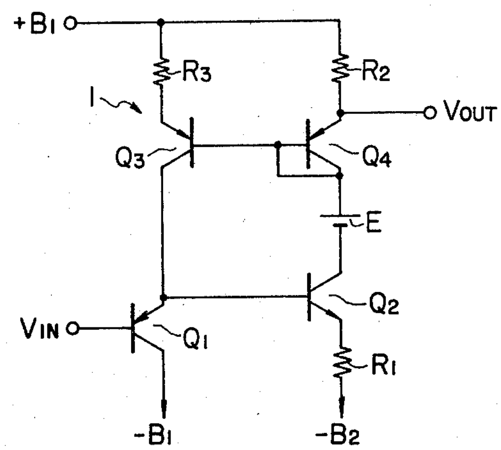
FIG. 1 is a schematic circuit diagram for a description of the principles of this invention.

FIG. 1 is a schematic diagram showing a circuit embodying the principles of the invention. An input signal $V_{IN}$ is applied to the base of a PNP transistor $Q_1$ forming an emitter follower circuit, the emitter follower output of which is applied to the base of an amplifying NPN transistor $Q_2$. The emitter of the transistor $Q_2$ is connected through an emitter resistor $R_1$ to a negative voltage source $-B_2$. The emitter of the transistor $Q_1$ is connected directly to a negative voltage source $-B_1$. The transistors $Q_1$ and $Q_2$ are coupled, for instance, to a current mirror circuit 1 which supplies currents $I_1$ and $I_2$ the ratio $I_1/I_2$ of which is constant ($I_1/I_2=1/\alpha$ where $\alpha$ is constant). The current mirror circuit 1, as shown in FIG. 1, includes PNP transistors $Q_3$ and $Q_4$ the bases of which are connected together and emitter resistors $R_2$ and $R_3$. The transistor $Q_4$ is diode-connected. The ratio $1/\alpha$ of the currents which are supplied to the transistors $Q_1$ and $Q_2$ is set to a desired constant value by appropriately selecting the values of the resistors $R_2$ and $R_3$. The voltage across the resistor $R_2$ is employed as an output $V_{OUT}$. A bias voltage source E is coupled between the collector of the transistor $Q_2$ and the collector of the transistor $Q_4$ in the current mirror circuit for determining the collector-emitter voltage $V_{CE}$ of the transistor $Q_2$.

For the circuit thus constructed, the following equation (1) can be established:

$$I_2=\{(V_{IN}+V_{BE1}-V_{BE2})+B_2\}/R_1, \quad (1)$$

where $V_{BE1}$ and $V_{BE2}$ are the base-emitter voltages of the transistors $Q_1$ and $Q_2$.

In general, the relation between the collector current $I_C$ of a transistor and the base-emitter voltage $V_{BE}$ is:

$$V_{BE}=\frac{kT}{q}\ln\left(\frac{I_C}{I_S}+1\right) \quad (2)$$

where q is the electron charge, k is Boltzmann's constant, T is absolute temperature, and $I_S$ is the base-emitter reverse saturation current.

From equation (2), $(V_{BE1}-V_{BE2})$ in equation (1) is:

$$V_{BE1}-V_{BE2}=\frac{k}{q}\left\{T_1\ln\left(\frac{I_1}{I_{S1}}+1\right)-T_2\ln\left(\frac{\alpha I_1}{I_{S2}}+1\right)\right\}, \quad (3)$$

where $T_1$ is the base-emitter junction temperature of the transistor $Q_1$ and $T_2$ is the base-emitter junction temperature of the transistor $Q_2$.

Since $I_S$ is a fixed constant value specific to each transistor, $I_{S2}=\beta I_{S1}$ where $\beta$ is constant. Since the value $I_S$ is small compared with the collector current ($I_C/I_S>>1$), the following equation (4) is established:

$$V_{BE1}-V_{BE2}\approx\frac{k}{q}\left\{T_1\ln\left(\frac{I_1}{I_{S1}}\right)-T_2\ln\left(\frac{\alpha I_1}{\beta I_{S1}}\right)\right\}.$$

In equation (4), the absolute temperatures $T_1$ and $T_2$ are the junction temperatures of the transistors. The absolute temperatures $T_1$ and $T_2$ become different if the power consumptions of the transistors are different. The values $V_{CE}$ and $I_C$ of each transistor vary with time depending on the amplitude of the applied signal and, accordingly, the heat dissipation $P_C=V_{CE}\neq I_C$ in the collector also varies with time. Thus, the absolute values $T_1$ and $T_2$ are generally different.

As the ratio $I_1/I_2$ of the currents of the transistors $Q_1$ and $Q_2$ is constant at $1/\alpha$, the heat dissipation in the collectors of the transistors $Q_1$ and $Q_2$ is the same if the following relation is established:

$$V_{CE1}/V_{CE2}=\alpha. \quad (5)$$

Accordingly, if the bias voltage source E, the circuit voltage sources $+B_1$, $-B_1$ and $-B_2$ have voltage values such that relation (5), i.e. $V_{CE1}/\alpha=V_{CE2}$, is satisfied, then $T_1=T_2=T$ in which case equation (4) can be rewritten into the following equation (6):

$$V_{BE1}-V_{BE2}\approx\frac{kT}{q}\ln(\beta/\alpha). \quad (6)$$

Equation (6) has a constant value. With the constant value represented by $\gamma$, equation (1) can be rewritten as the following equation (7):

$$I_2=(V_{IN}+\gamma+B_2)/R_1. \quad (7)$$

Accordingly, the output voltage $V_{OUT}$ can be expressed as:

$$V_{OUT}=I_2R_2=\frac{R_2}{R_1}(V_{IN}+\gamma+B_2). \quad (8)$$

As is clear from equation (8), the output voltage $V_{OUT}$ is completely independent of $V_{BE}$ and is a distortionless amplified output.

Figure 2:
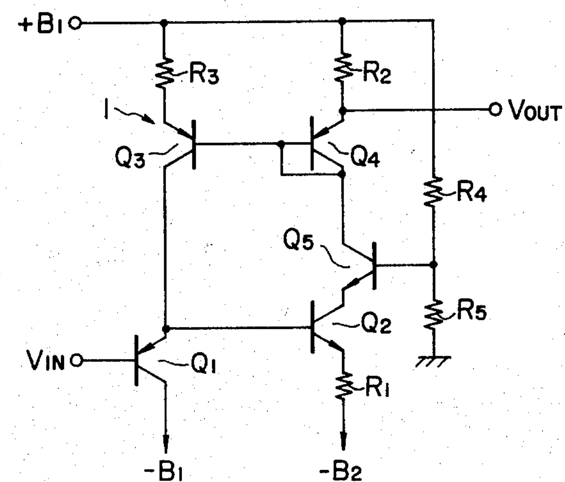
FIG. 2 is a schematic circuit diagram showing a preferred embodiment of an amplifier circuit constructed according to the invention.

A specific example of a circuit of the invention including a bias source E is shown in FIG. 2 in which those components which are identical with those in FIG. 1 are designated by the same reference characters and numerals.

The bias source E is provided by cascade-connecting an NPN transistor $Q_5$ between the transistor $Q_4$ of the current mirror circuit 1 and the output transistor $Q_2$. The base bias of the cascade-connected transistor $Q_5$ is a constant voltage which is set with a voltage divider circuit composed of resistors $R_4$ and $R_5$ connected between the voltage source $+B_1$ and ground.

As is clear from the above description, according to the invention, distortion due to the non-linear characteristics of the transistors can be completely eliminated and therefore the amplifier according to the invention has a quite excellent performance.

The output can be formed utilizing the variations of current in the transistor $Q_1$ or $Q_2$. Accordingly, the invention is not limited to the specific circuits described above. For instance, if a resistor is inserted in the collector current path of the transistor $Q_2$, then the voltage across the resistor may be employed as the output. If it is unnecessary to provide a high amplification factor, the voltage across the emitter resistor $R_1$ of the transistor $Q_2$ may be used as the output. Alternatively, the voltage across a resistor inserted between the collector of the transistor $Q_1$ and ground or the emitter and the current supply may be employed as the output. Furthermore, the voltage across the resistor $R_3$ can be employed as the output.

What is claimed is:

1. An amplifier circuit comprising:

a first transistor to the base of which an input signal is applied;

a second transistor of an opposite conductivity type to said first transistor and to the base of which an output of said first transistor is applied;

means for supplying currents to said first and second transistors in such a manner that the ratio of said current supplied to said first transistor to said current supplied to said second transistor is a predetermined constant value; and bias generating means for providing bias voltage to said first and second transistors so that the ratio of a collector-emitter voltage of said first transistor to a collector-emitter voltage of said second transistor is the reciprocal of said constant value so as to provide an output in response to variations of current in said first or second transistor.

2. The amplifier as claimed in claim 1 in which said first transistor is coupled in an emitter follower configuration.

3. The amplifier as claimed in claim 1 or 2 wherein said current supplying means comprises a current mirror circuit.

4. The amplifier as claimed in claims 1 or 2 wherein said bias generating means comprises a biasing means connected between said current supplying means and said second transistor.

5. An amplifier circuit comprising:

a first PNP transistor, an input signal being coupled to the base of said first PNP transistor and the collector of said first PNP transistor being coupled to a first voltage source terminal;

an NPN transistor, the base of said first NPN transistor being coupled to the emitter of said first PNP transistor and the emitter of said first NPN transistor being coupled through a first resistor to a second voltage source terminal;

a second PNP transistor, the collector of said second PNP transistor being coupled to the emitter of said first PNP transistor and the emitter of said second PNP transistor being coupled through a second resistor to a third voltage source terminal;

a third PNP transistor, the base of said third PNP transistor being coupled to the base of said second PNP transistor and to the collector of said third PNP transistor, the emitter of said third PNP transistor being coupled through a third resistor to said third voltage source terminal; and a voltage source having a positive terminal coupled to said collector of said third PNP transistor and a negative terminal coupled to the collector of said NPN transistor;

wherein the value of said second and third resistors are selected to set the ratio of currents supplied to said first PNP transistor and to said NPN transistor at a predetermined constant value and wherein the voltage is applied to said first, second and third voltage source terminals and the voltage of said voltage source are selected such that the ratio of the collector-emitter voltage of said first PNP transistor to the collector-emitter voltage of said NPN transistor is the reciprocal of said constant value.

6. The amplifier circuit as claimed in claim 5 wherein said voltage source comprises a second NPN transistor, the emitter of said second NPN transistor being coupled to said collector of said first-mentioned NPN transistor and the collector of said second NPN transistor being coupled to said collector of said third PNP transistor, a fourth resistor coupled between the base of said second NPN transistor and said third voltage source terminal, and a fifth resistor coupled between said base of said second NPN transistor and a terminal at a ground potential with respect to said first, second and third voltage source terminals.

* * * * *